(12) United States Patent
Kesar

(10) Patent No.: US 11,201,609 B2
(45) Date of Patent: Dec. 14, 2021

(54) COMPACT HIGH-VOLTAGE NANOSECOND PULSED-POWER GENERATOR

(71) Applicant: Soreq Nuclear Research Center, Yavne (IL)

(72) Inventor: Amit Kesar, Ramat Gan (IL)

(73) Assignee: Soreq Nuclear Research Center, Yavne (IL)

(*) Notice: Subject to any disclaimer, the term of this patent is extended or adjusted under 35 U.S.C. 154(b) by 67 days.

(21) Appl. No.: 16/496,519

(22) PCT Filed: Mar. 27, 2018

(86) PCT No.: PCT/IB2018/052091
§ 371 (c)(1),
(2) Date: Sep. 23, 2019

(87) PCT Pub. No.: WO2018/178867
PCT Pub. Date: Oct. 4, 2018

(65) Prior Publication Data
US 2021/0111710 A1 Apr. 15, 2021

Related U.S. Application Data

(60) Provisional application No. 62/477,454, filed on Mar. 28, 2017.

(51) Int. Cl.
*H03K 3/00* (2006.01)
*H03K 3/57* (2006.01)

(52) U.S. Cl.
CPC .................... *H03K 3/57* (2013.01)

(58) Field of Classification Search
CPC ....................................... H03K 3/57
USPC ....................................... 327/291
See application file for complete search history.

(56) References Cited

U.S. PATENT DOCUMENTS 6,087,871 A * 7/2000 Kardo-Syssoev ........ H03K 3/57
327/189

OTHER PUBLICATIONS

PCT Search Report PCT/IB2018/052091, dated Jul. 26, 2018.
(Continued)

*Primary Examiner* — Metasebia T Retebo
(74) *Attorney, Agent, or Firm* — Dekel Patent Ltd.; David Klein

(57) ABSTRACT

A pulsed-power circuit includes first, second, third and fourth compression stages. The first and second stages each include at least one pre-charged capacitor and at least one inductor in series, and at least one switch operative to pump a DSRD (drift-step-recovery diode). The pre-charged capacitor of the second stage is pre-charged in negative direction with respect to the pre-charged capacitor of the first stage. The third and fourth stages each include at least one DSRD. The switches of the first and second stage are operative to drive (pump and then pulse) the DSRDs of the third and fourth stages.

4 Claims, 2 Drawing Sheets

(56) References Cited

OTHER PUBLICATIONS

Kesar Amit, Merensky, L.M., et al., "6 kV, 130 ps, Rise Time Pulsed Power Circuit Featuring Cascaded Compression by Fast Recovery and Avalanche Diodes", Electronic Letters, vol. 49, No. 24, pp. 1539-1540, Nov. 21, 2013.

Merensky, L.M. et al., "Efficiency Study of a 2.2 kV, 1 ns, 1MHz Pulsed Power Generator Based on a Drift-Step-Recovery Diode", IEEE Transactions on Plasma Science, IEEE Service Center, Piscataway, NJ, vol. 41, No. 11, pp. 3138-3142, Nov. 1, 2013.

Prokhorenko et al., "Drift Step Recovery Diode Transmitter for High Power GPR Design", Proceedings of SPIE, vol. 4084, pp. 277-281, Apr. 27, 2014.

* cited by examiner

COMPACT HIGH-VOLTAGE NANOSECOND PULSED-POWER GENERATOR

FIELD OF THE INVENTION

The present invention relates generally to pulsed-power generators, and particularly to a compact high-voltage nanosecond pulsed-power generator.

BACKGROUND OF THE INVENTION

High peak-power pulses from nanosecond pulsed-power generators are useful for a variety of applications such as pollution control by ozone production, ignition system for internal combustion engines, biological research, underground detection, and beam steering in accelerators. They are also useful for driving fast, 100-ps, avalanche diodes.

Drift-step-recovery diodes (DSRDs) are highly-compact opening switches that can be used with an inductor to commutate HV nanosecond pulses into a load. The design and production of these switches is currently very limited.

A prior art circuit using a DSRD is shown in FIG. 4, taken from J. D. Taylor, Ultra-Wideband Radar Technology. New York: CRC Press, 2001.

Initially capacitor $C_1$ is charged and capacitor $C_2$ is discharged. In the first step switch $S_1$ closes, which results in DSRD pumping (forward direction current). In the second step, switch $S_2$ closes, which results in DSRD pulsing (reverse direction current). When the total charge that was stored in the DSRD junction during the forward (pumping) cycle is removed by the reverse (pulsing) cycle, the DSRD stops conducting the current and a high-voltage pulse appears at the load, $R_L$. Switch $S_2$ should pass the total current and the prior art uses a magnetic switch for this purpose.

The DSRD operation requires a prime switch to pump its junction with carriers in the forward direction, and then to pulse it quickly in the reverse direction and discharge the stored carriers. Fast pulsing is necessary in order to achieve a high compression ratio between the load peak voltage and the supply voltage. The prior art has used metal-oxide semiconductor field effect transistors (MOSFETs) for this purpose.

SUMMARY OF THE INVENTION

The present invention seeks to provide a compact circuit design for producing nanosecond high-voltage (HV) pulses, as is described more in detail hereinbelow. The present invention provides a compact high-voltage (>5 kV) pulsed-power generator with a rise time of the order of a few nanoseconds (<5 ns). The method is based on a series inductor-capacitor (LC) compression with a fast high-voltage recovery diode, such as a drift-step-recovery diode (DSRD).

In contrast with the prior art, the present invention uses commercially available off-the-shelf (COTS) components, which is advantageous for all of the above-mentioned applications, and which provides significant savings over the prior art, as well as being much more compact in design than any of the prior art designs.

BRIEF DESCRIPTION OF THE DRAWINGS

The present invention will be understood and appreciated more fully from the following detailed description, taken in conjunction with the drawings in which.

DETAILED DESCRIPTION OF EMBODIMENTS

Figure 1:
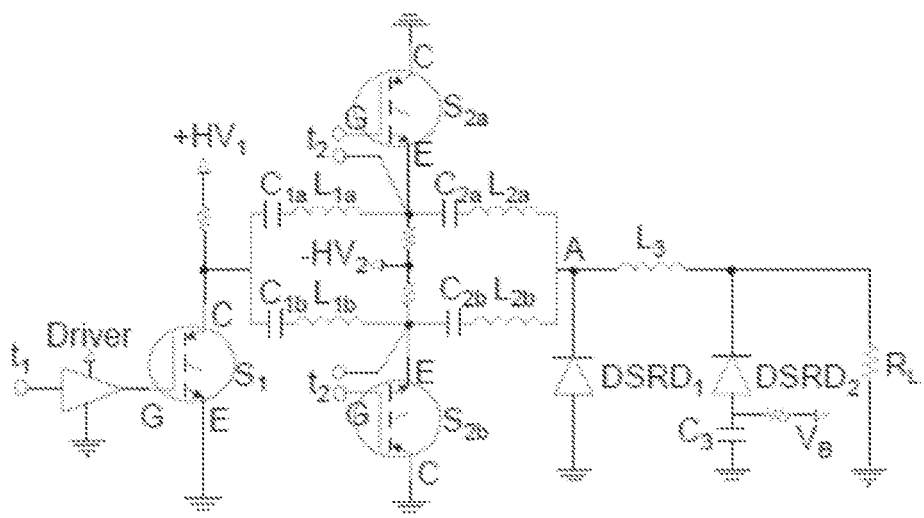
FIG. 1 is a simplified schematic of a pulsed-power circuit for a compact high-voltage nanosecond pulsed-power generator (e.g., 10 kV, 1.85 ns rise-time), in accordance with a non-limiting embodiment of the invention.

Reference is now made to FIG. 1, which illustrates a pulsed-power circuit for a compact high-voltage nanosecond pulsed-power generator, in accordance with a non-limiting embodiment of the present invention.

The compact pulsed-power circuit may be made of COTS solid-state switching components. The circuit may have four compression stages. The first stage consists of a pre-charged capacitor and an inductor in series, where a switch, such as an IGBT (insulated-gate bipolar transistor) is used for the DSRD pumping. The second stage is similar to the first one, with the exception of its capacitor being pre-charged in the negative direction. The pre-charge in the negative direction allows an enhanced performance for the DSRD pulsing, without any need for a magnetic switch of the prior art. Accordingly, in contrast with the prior art, in the present invention, capacitor $C_2$ is pre-charged in the negative direction with respect to the pre-charging of capacitor $C_1$. This allows an enhanced performance in pulsing of the DSRD, resulting in a high DC to peak pulse compression ratio, in a compact generator.

Further compression can be achieved if two DSRDs are operated in a cascaded operation mode. Accordingly, in one embodiment, there are third and fourth stages that include DSRDs operated in a cascaded compression mode, where a small bias voltage allows the balancing of their pumping charges. The switches of the first and second stages drive (pump and then pulse) the DSRDs of the third and fourth stages.

It is noted that cascaded operation is described in A. S. Kesar, L. M. Merensky, M. Ogranovich, A. F. Kardo-Sysoev, and D. Shmilovitz, "6-kv, 130-ps rise-time pulsed-power circuit featuring cascaded compression by fast recovery and avalanche diodes," Electronics Letters, vol. 49, no. 24, pp. 1539-1540, 2013 (herein "Kesar et al."). In Kesar et al., both DSRDs in the cascade have their anode on a high voltage bias (high means that the voltage bias is of the order of the high-voltage supply). In contrast, in the present invention, the first DSRD is grounded and the second DSRD has a small voltage bias (for example, only a few volts, which is small with respect to the initial charging of capacitors $C_1$ and $C_2$). This small bias is sufficient for a balanced-charge operation.

The circuit size, not including its power supplies, was 100×50×30 mm. Its output to a 50Ω load was above 10 kV (2 MW) with a rise-time of 1.85 ns. The invention is not limited to this size and output.

The pulsed-power generator is an order of magnitude more compact with respect to commercial products, as shown in Table 1.

TABLE 1

Comparison of commercial products to the
pulsed-power generator of the invention

|  | Company | | |
| --- | --- | --- | --- |
|  | FID Technology | Megaimpulse | The present invention |
| Product | FPM 10-N | NPG 15-2000 |  |
| HV output | 10 kV to 50 Ohm | 15 kV to 75 Ohm | 10 kV to 50 Ohm |
| Rise-time | 1-5 ns | 4 ns | Approx. 2 ns |
| Dimensions [mm] | 200 × 120 × 60 | 248 × 90 × 250 | 100 × 50 × 30 |
| Specific power [W/mm^3] | 1.39 | 0.72 | 14 |

Referring again to the circuit of FIG. 1, positive, $+HV_1$, and negative, $-HV_2$, high-voltage supplies may be used for charging the circuit capacitors. The circuit may include four compression stages, as mentioned above. In the non-limiting illustrated circuit, the first stage consists of an IGBT ($S_1$=IRG7PH50UPbF by International Rectifier), two capacitors ($C_{1a}=C_{1b}=20$ nF) pre-charged to $HV_1+|HV_2|$, and two inductors ($L_{1a}=L_{1b}=200$ nH). The second stage consists of two IGBTs ($S_{2a}=S_{2b}$=IRG7PH50UPbF), two capacitors ($C_{2a}=C_{2b}=20$ nF) pre-charged to $-HV_2$, and two inductors ($L_{2a}=L_{2b}=150$ nH). As shown in FIG. 1, the safe parallel operation of $S_{2a}$ and $S_{2b}$ is due to the splitting of their capacitors and inductors, namely, $S_{2a}$ operates with $C_{1a}$, $L_{1a}$, $C_{2a}$, and $L_{2a}$, and $S_{2b}$ operates with the capacitors and inductors with the subscript "b". The design of two branches in parallel is due to the estimated current in the second compression stage being more than twice the current in the first stage.

The third and fourth stages consist of DSRDs, where the current is compressed via an inductor ($L_3=70$ nH). The second DSRD is biased by a capacitor ($C_3=2$ µF) pre-charged to a small bias voltage, $V_B$, which allows the balancing of their pumping charges. The DSRDs were built using 1-kV cell rectifier diodes (CN25M by EIC). These diodes were found to have a snappy reverse recovery when operated in DSRD mode. $DSRD_1$ consists of ten stacks in parallel, each stack containing four diodes in series. $DSRD_2$ consists of seven stacks in parallel, each stack containing seven diodes in series.

In order to pump the DSRDs, $S_1$ is turned on. This IGBT is driven at time $t_1$ by its driver (MIC4452 by Micrel). In order to pulse the DSRDs, IGBTs $S_{2a}$ and $S_{2b}$ are turned on simultaneously at $t_2=t_1+\Delta T$. These IGBTs are driven via an isolating transformer (not shown in FIG. 1). The transformer consists of two primary coils and two secondary coils, each consisting of five turns on a toroid ferrite core (outer diameter 20 mm, inner diameter 9.5 mm, height 10 mm, relative permeability ≈1500). MIC4452 drivers were connected to the primary coils and each secondary coil was connected to the gate and emitter of its respective IGBT. The output pulse was measured on the load ($R_L=50\Omega$).

Figure 2:
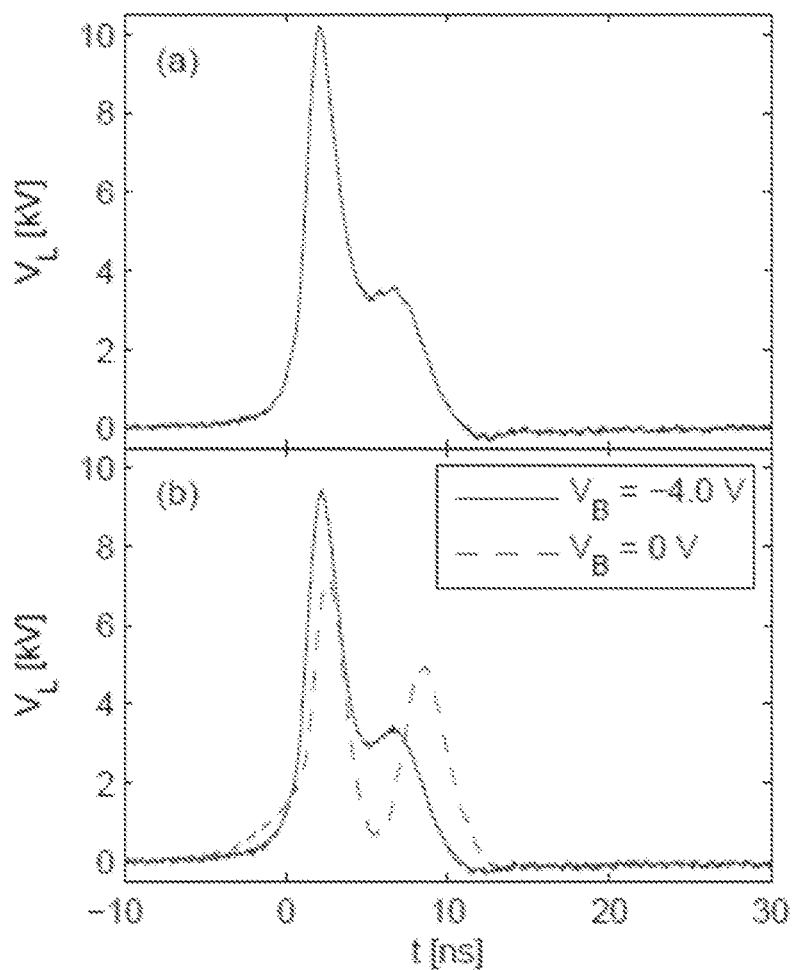
FIG. 2 is a graphical illustration of load peak voltage versus time for the circuitry of FIG. 1, wherein in graph (a), $HV_1=850$ V, $HV_2=-320$ V. and in graph (b), $HV_1=800$ V, $HV_2=-200$ V and wherein $V_B=-4.0$ V (solid line) and $V_B=0$ V (dashed line).

The circuit shown in FIG. 1 was operated with a delay time between the first and second IGBTs of $\Delta T=150$ ns. The high-voltage supplies were $HV_1=850$ V, and $HV_2=-320$ V. The bias voltage of DSRD2 was $V_B=-4.4$ V. The result is shown in FIG. 2(a). The load peak voltage was 10.3 kV, and its rise-time (10-90%) was 1.85 ns.

The effect of the bias voltage, $V_B$ on the output is shown in FIG. 2(b). In this graph $HV_1$ was 800 V, and $HV_2$ was −200 V. The load voltage versus time when $V_B$ was −4.0 V and 0 V is shown by the solid and dashed lines, respectively.

As shown, when $V_B$ was optimized, the load peak voltage was 9.4 kV. When $V_B$ was zero, two peaks are seen, where the higher one was 7.2 kV.

Figure 3:
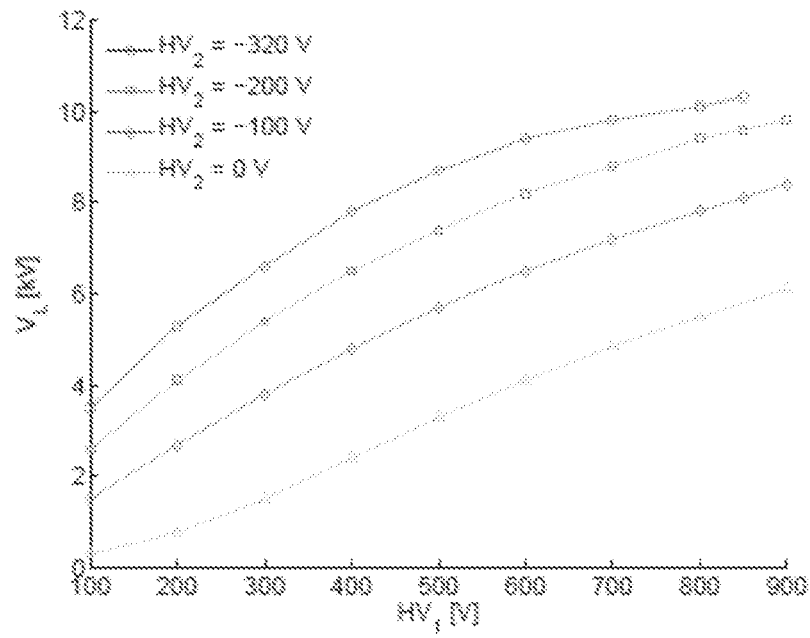
FIG. 3 is a simplified graphical illustration of load peak voltage versus $HV_1$ for various values of $HV_2$.
Figure 4:
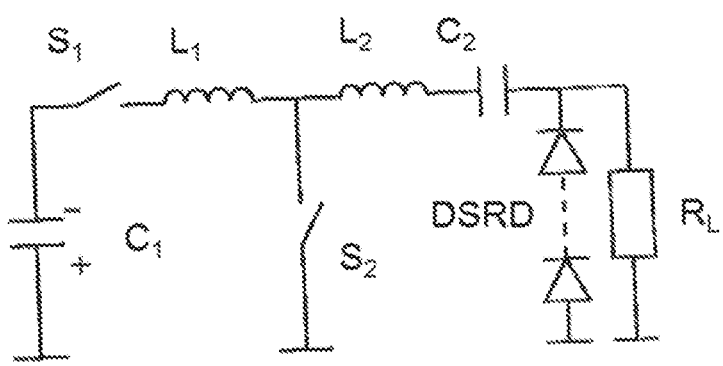
FIG. 4 is a simplified illustration of a prior art circuit using a DSRD.

The load peak voltage versus the positive high-voltage, $HV_1$, is shown in FIG. 3, for various values of the negative high-voltage, $HV_2$, of −320 V (circle marks), −200 V (square marks), −100 V (diamond marks), and 0 V (triangle marks). As seen in this graph, the negative high-voltage (which charges $C_{2a}$ and $C_{2b}$) results in enhanced performance. When $HV_2$ was zero, the peak load voltage in the case of $HV_1$=900 V was 6.1 kV. When $HV_2$ was −320 V and $HV_1$ was 500 V, e.g. the total energy in the capacitors was lower than in the previous case, a higher load peak voltage of 8.7 kV was obtained, the load peak power having doubled. Since the IGBTs were rated to 1200 V, the maximum allowed voltage on charging C1a and C1b was $HV_1+|HV_2|\leq1200$ V.

Accordingly, the embodiment of FIG. 1 is a highly compact, 100×50×30 mm, circuit with an output of 10.3-kV, 1.85-ns rise-time that uses COTS components. Its output power per circuit volume is 14 W/mm$^3$, which is a factor of ten greater than prior art circuits which use a magnetic switch. It is noted that a more compact circuit size is possible with a custom-designed DSRD.

The capacitors of the second compression stages, $C_{2a}$ and $C_{2b}$ were pre-charged to a negative high-voltage. This feature enhances the peak voltage at the load, FIG. 3, and eliminates the need for a magnetic switch. Since the current in the second compression stage is estimated at more than twice the current in the first stage, two IGBTs were used in parallel. An additional design feature is the introduction of a small bias voltage (compared to the HV supplies), at the anode of $DSRD_2$. Only a few volts were required for balancing the cascaded operation of the DSRDs, FIG. 2(b).

The invention may be utilized to produce higher peak load voltages by increasing the number of the IGBTs. For example, three more IGBTs in a similar configuration can be connected to point "A" in FIG. 1 in order to drive the DSRDs at a higher current. In this case, the DSRDs should be changed in order to support a higher peak power.

What is claimed is:

1. A pulsed-power device comprising:
   a pulsed-power circuit comprising first, second, third and fourth compression stages, the first and second compression stages each comprising at least one pre-charged capacitor and at least one inductor in series, and at least one switch operative to pump a DSRD (drift-step-recovery diode), wherein the pre-charged capacitor of the second compression stage is pre-charged in negative direction with respect to the pre-charged capacitor of the first compression stage; and the third and fourth compression stages each comprise at least one DSRD, and wherein said switches of the first and second compression stages are operative to drive (pump and then pulse) the DSRDs of the third and fourth compression stages, wherein said at least one switch of the second compression stage comprises two switches in parallel.

2. The pulsed-power device according to claim 1, wherein said DSRDs are operated in a cascaded compression mode.

3. The pulsed-power device according to claim 2, wherein a bias voltage is used to balance pumping charges of said DSRDs.

4. A pulsed-power device comprising:
   a pulsed-power circuit comprising first, second, third and fourth compression stages, the first and second compression stages each comprising at least one pre-charged capacitor and at least one inductor in series, and at least one switch operative to pump a DSRD (drift-step-recovery diode), wherein the pre-charged capacitor of the second compression stage is pre-charged in negative direction with respect to the pre-charged capacitor of the first compression stage; and the third and fourth compression stages each comprise at least one DSRD, and wherein said switches of the first and second compression stages are operative to drive (pump and then pulse) the DSRDs of the third and fourth compression stages, wherein said at least one switch of each of the first and second compression stages comprises an IGBT (insulated-gate bipolar transistor), wherein said DSRDs are operated in a cascaded compression mode, and wherein a bias voltage is used to balance pumping charges of said DSRDs.

* * * * *